United States Patent [19]

Sachdev et al.

[11] Patent Number: 4,493,855
[45] Date of Patent: Jan. 15, 1985

[54] USE OF PLASMA POLYMERIZED ORGANOSILICON FILMS IN FABRICATION OF LIFT-OFF MASKS

[75] Inventors: Harbans S. Sachdev; Krishna G. Sachdev, both of Wappingers Falls, N.Y.

[73] Assignee: International Business Machines Corporation, Armonk, N.Y.

[21] Appl. No.: 452,549

[22] Filed: Dec. 23, 1982

[51] Int. Cl.³ .................................. B05D 3/06
[52] U.S. Cl. .................................. 427/41; 427/88; 427/96; 430/314; 156/643; 204/192 E
[58] Field of Search .................. 427/41, 40, 88, 96, 427/259, 24; 430/314; 156/643; 204/192 E

[56] References Cited

U.S. PATENT DOCUMENTS

| | | |
|---|---|---|
| 2,257,177 | 9/1941 | Luster . |
| 3,262,808 | 7/1966 | Crooks et al. . |
| 3,287,242 | 11/1966 | Tobin et al. . |
| 3,310,424 | 3/1967 | Wehner et al. . |
| 3,632,386 | 1/1972 | Hurst . |
| 3,686,018 | 8/1972 | Lindblom et al. . |
| 3,702,833 | 11/1972 | Rose et al. . |
| 3,732,158 | 1/1971 | Przybyszewski et al. . |
| 3,822,928 | 7/1974 | Smolinsky et al. . |
| 3,847,652 | 11/1974 | Fletcher et al. . |
| 3,867,216 | 2/1975 | Jacob . |
| 3,873,361 | 3/1975 | Franco et al. . |
| 3,912,461 | 10/1975 | Wakefield . |
| 3,948,820 | 4/1976 | Reynard et al. . |
| 3,953,115 | 4/1976 | French et al. . |
| 3,971,684 | 7/1976 | Muto . |
| 3,984,301 | 10/1976 | Matsuzaki et al. . |
| 4,004,044 | 1/1977 | Franco et al. ........................ 427/43 |
| 4,013,463 | 3/1977 | Leder . |
| 4,013,532 | 3/1977 | Cormia et al. . |
| 4,018,945 | 4/1977 | Mehalso . |
| 4,026,742 | 5/1977 | Fujino . |
| 4,035,276 | 7/1977 | Havas et al. . |
| 4,085,248 | 4/1978 | Zehender et al. . |
| 4,091,166 | 5/1978 | Kubacki . |
| 4,137,330 | 1/1979 | Prichard . |
| 4,137,365 | 1/1979 | Wydeven et al. . |
| 4,138,306 | 2/1979 | Niwa . |
| 4,163,725 | 8/1979 | Sano et al. . |
| 4,202,914 | 5/1980 | Havas et al. . |
| 4,212,719 | 7/1980 | Osada et al. . |
| 4,226,896 | 10/1980 | Coburn et al. . |
| 4,260,647 | 4/1981 | Wang et al. . |
| 4,272,561 | 6/1981 | Rothman et al. . |
| 4,279,723 | 7/1981 | Osada et al. ........................ 204/164 |
| 4,292,397 | 9/1981 | Takeuchi et al. ................... 430/303 |
| 4,371,407 | 2/1983 | Kurosawa .......................... 148/187 |
| 4,382,985 | 5/1983 | Hattori et al. ...................... 427/41 |

*Primary Examiner*—Michael R. Lusignan
*Assistant Examiner*—K. Jaconetty
*Attorney, Agent, or Firm*—Henry Powers

[57] ABSTRACT

Pinhole-free thin films deposited by glow discharge or plasma polymerization of organosilanes, organosilazones and organosiloxanes for use as reactive ion etch oxygen barriers in multilayer resist structures, of lift-off masks, for fabrication of semiconductor devices, such as integrated circuits. The process includes deposition of thin plasma polymerized organosilicon barrier film over a radiation insensitive polymeric base layer previously coated on a substrate, followed by thermal annealing of the plasma polymerized barrier layer, over which is then coated a radiation sensitive resist layer. After definition of the desired resist pattern by imagewise exposure and development, the image is etch transferred into the barrier layer by reactive sputter etching in a fluorine containing ambient, and subsequently transferred into the base layer, down to the substrate, in an oxygen plasma, during which time the plasma deposited film functions as an oxygen barrier. Final metal patterns are formed by metallization and lift-off steps.

6 Claims, 10 Drawing Figures

USE OF PLASMA POLYMERIZED ORGANOSILICON FILMS IN FABRICATION OF LIFT-OFF MASKS

DESCRIPTION

TECHNICAL FIELD

This invention relates to the fabrication of semiconductor components such as integrated circuits, and more particularly to the use of thin films deposited by glow discharge or plasma polymerization of organosilicon monomers as oxygen reactive ion etch barriers during pattern delineation in high resolution lithography processes for large scale integrated circuitry.

One object of this invention is to provide a method for forming defect-free polyorganosilicon films.

Another object of this invention is to provide pinhole-free oxygen RIE barrier for lift-off masks employed in the fabrication of semiconductor components.

Another object of this invention is to provide novel and improved oxygen RIE barrier films for lift-off masks employed for forming interconnecting metallurgy systems for semiconductor components.

Another object of this invention is to provide a lift-off mask with improved oxygen barrier layers which eliminate interlevel shorts caused by pinholing occasioned in conventional oxygen RIE barrier films, such as silicon oxide and silicon nitride.

Another object of this invention is to provide a pinhole free plasma polymerized oxygen barrier film formed from non-pyrophoric organosilicon monomers which are liquids at room temperature as an improved replacement for silicon oxide and nitride barrier films which are normally formed from hazardous silane ($SiH_4$) and disilane ($Si_2H_6$) gases. The films thus prepared are useful as oxygen etch barrier with good dielectric properties.

BACKGROUND ART

With continued miniaturization of semiconductor integrated circuits to achieve greater component density and smaller units, as in large scale integrated circuits, it is required that high resolution lithographic processes be developed for dense metallization networks. A major factor limiting resolution of micron and submicron resist images in electron beam lithography using single layer thick resist films, is the proximity effect due to electron scattering. As a result, multilayer resist approaches that employ thin imaging layers to eliminate or minimize the problems of proximity effect and having increased resist sensitivity are receiving an increased focus of attention by the research and development areas for submicron lithography. Similarly, in optical lithography using refractive projection mask aligners, multilayer resist processes overcome the problems of resolution and aspect ratio because of depth of field limitations in the case of single layer resist images.

A trilevel resist process for integrated circuit devices, typically, comprises a radiation insensitive polymer base layer, a thin $O_2$/RIE resistant barrier layer and a thin E-beam, UV or X-ray resist layer. The polymeric base layer is generally applied by spin-coating on a substrate followed by a curing step and deposition of the $O_2$/RIE barrier film which is overcoated with a thin coating of an imaging (resist) layer. The $O_2$/RIE barrier films conventionally employed in the prior art are mostly inorganic in nature, such as plasma deposited silicon oxide, vacuum evaporated SiO, sputtered quartz and chemical vapor deposited (CVD) silicon nitride. Further information can be obtained on reference to the Havas et al. U.S. Pat. No. 4,202,914; J. Moran, Pol. Eng. Sci. 20, 1097 (1980); L. Rothman, IBM Technical Disclosure Bulletin 23, 2293 (1980); and P. Grabbe et al. J. Vac. Sci. & Tech. 21, 33 (1982).

One method of employing these multilevel resist (MLR) techniques for forming meallization patterns on devices is commonly denoted by the term "expendable mask method", "lift-off method" or "stencil method", which was initially described in U.S. Pat. No. 2,559,389. Improvements to the basic "lift-off method" have been made, as for example, in U.S. Pat. Nos. 3,849,136; 3,873,361; 4,004,044 and 4,202,914.

In conformance with the foregoing, this "lift-off" method includes the use of organic polymeric material as a base or sub-layer on an integrated circuit substrate and a overlying oxygen RIE resistant layer of a diverse material, such as a metal layer, silicon dioxide, silicon nitride or a polydimethylsiloxane, having openings in a selected pattern. Where polydimethysiloxanes have been proposed as oxygen RIE barrier films, they have been solution coated or cast on the polymeric base layer. See the above noted patent of Franco et al. U.S. Pat. No. 4,004,044, and L. Fried in IBM J. of Res. and Dev. 26, 362 (1982).

After deposition of the oxygen barrier mask, corresponding openings are conventionally formed or transferred in the polymeric base layer by reactive ion etching (RIE) in an oxygen ambient utilizing the overlying barrier film as a dry etch mask. The desired thin film, e.g. metal, to be deposited, is then blanket coated over the structure and on the surface exposed by the openings in the polymeric base layer.

When the polymeric base layer is removed by application of a solvent selective for it, the overlying barrier layer and thin film, above the barrier layer, "lift-off" to leave the thin film deposited in the selected pattern on the substrate.

Although, the conventional inorganic and solution coated polydimethylsiloxane films have been effective masking layers in $O_2$/RIE processes and have been employed in multilevel metal process for fabrication of integrated circuit devices, there are some problems encountered with these materials which detract from their consistency of function and thus renders that application less attractive in lithographic processes designed for submicron patterning. For example, coherent thin films of silicon oxide or silicon nitride are formed at relatively high deposition temperatures, e.g. 200°-275° C., which results in debris generation at the organic-inorganic interface, and thus problems of reticulation and shriveling are often encountered. A single major disadvantage of inorganic oxygen etch barrier films is a too frequent occurrence of high defect densities that are above the acceptable limits for high resolution lithographic applications. The solution coated or cast thin films of poly(dimethylsiloxanes) and "glass resins", on the other hand, above the problems of non-uniformity, thickness control and shelf life of polymer solutions due to the presence of a certain amount of reactive groups on the polymer chain.

BRIEF DESCRIPTION OF THE DRAWINGS

In the accompanying drawings forming a material part of this disclosure.

DISCLOSURE OF THE INVENTION

Figure 1A:
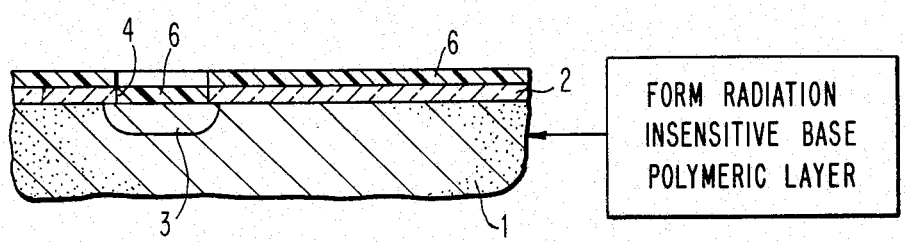
FIGS. 1A to 1H are diagrammatic cross-sectional views illustrating a portion of a substrate on various stages of processing during the practice of this invention.
Figure 1B:
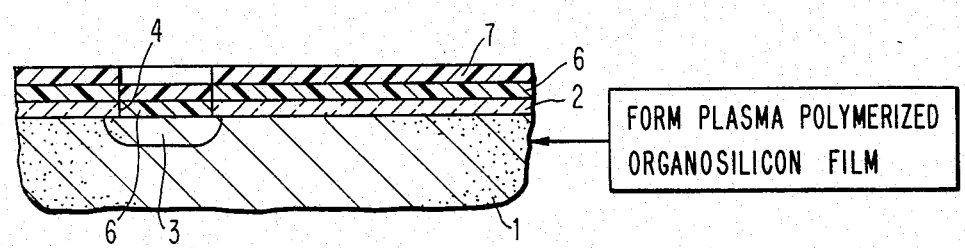

For further comprehension of the invention, one of the objects and advantages thereof, reference will be had to the following description and accompanying drawings, and to the appended claims in which the various features of the invention are more particularly set forth.

Briefly, the improved multilayer resists or lift-off process of this invention employs glow discharge or plasma polymerized organosilicon oxygen etch resistant films as improved replacement or substitutes for conventional inorganic silicon oxide or silicon nitride film in multilevel or lift-off processes for fine line lithography. The materials of this invention also provide novel and improved oxygen RIE barrier film over solution deposited films of polyorganosiloxanes such as "glass resins" or poly(dimethylsiloxane)resin.

Thin films deposited by glow discharge or plasma polymerization of organosilicon monomers are known to be useful as protective coatings for passivation and encapsulation, antireflection coatings for conventional optics, dielectrics in microelectronics, thin light wave guides, and moisture resistant barriers of alkali halide optics. Discussion and description can be found in U.S. Pat. Nos. 3,847,652; 4,013,532; 4,018,945; 4,137,365; 4,212,719; 4,226,896; 4,260,647; and 4,279,723; as well as the publications of M. Maisonneune et al., Thin Solid Films 33, 35 (1975); Y. Segui et al. sbid 50, 321 (1978); M. Aktik et al. J. Appl. Physics 51, 5055 (1980); M. P. Schrieber et al. Thin Solid Films 72, 487 (1980); and T. Hirotsu J. Applied Poly. Sci. 24, 1957 (1979).

The organosilicon polymers can be formed by glow discharge or plasma polymerization of monomers, of organosilicons including organosilanes, organosilazanes, organosiloxanes and mixtures thereof having the general configurations:

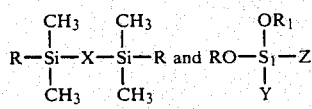

where

X = zero or oxygen, NH, NR$_2$, CH$_2$ or

group;

Y = OR$_1$ or R$_3$ group;

Z = —CH=CH$_2$, —C≡CH, —OR$_1$; phenyl or an aminoalkane group;

R is CH$_3$, —CH=CH$_2$, —O—CH$_3$, —O—CH=CH$_2$—O—Si—CH$_3$, or —Si—CH=CH$_2$; and R$_1$ R$_2$ and R$_3$ are alkyl groups, preferably having from 1 to 3 carbon atoms.

Illustrative of the material contemplated are:

Me$_3$Si—O—SiMe$_3$: Hexamethyldisiloxane,

Me$_3$Si—NH—SiMe$_3$: Hexamethyldisilazane,

H$_2$N (CH$_2$)$_3$Si(OEt)$_3$: γ-aminopropyl triethoxy silane,

H$_2$C=CH—Si(OMe)$_3$: Vinyl trimethoxy silane,

H$_2$C=CH—Si(OEt)$_3$: Vinyl triethoxy silane,

HC≡C—Si(OEt)$_3$: Ethynyltriethoxy silane,

Et—Si(OMe)$_3$: Ethyltrimethoxy silane,

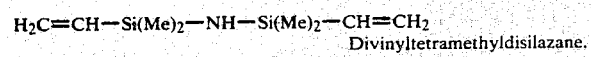

Divinyltetramethyldisilazane,

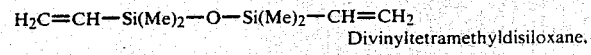

Divinyltetramethyldisiloxane,

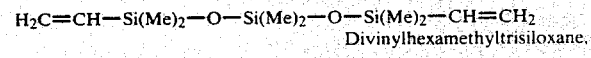

Divinylhexamethyltrisiloxane,

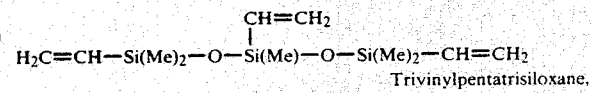

Trivinylpentatrisiloxane,

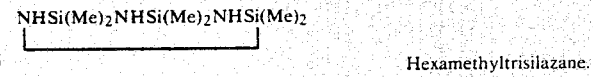

Hexamethyltrisilazane.

These materials can be used singly or in admixture with each other. The composition can be readily varied to in accordance with desired film properties in terms of hydrophobicity and thermal stability, mechanical strength, adhesion, compatibility with contacting surfaces and oxygen etch rates. The plasma polymerized organosilicon films obtained are thermally stable when heated up to 450° C., they are resistant to most development and lift-off solvents, have good adhesion to contacting organic layers and have essentially zero etch rate in O$_2$ plasma or RIE, but can be etched by RIE in ambients containing CF$_4$, CHF$_3$, or CF$_4$/O$_2$. These films can also be employed as interlayer between organic or organic-inorganic polymer films without requiring application of adhesion promoters or other surface modifications.

The MLR or "lift-off" mask is completed by overcoating the plasma polymerized organosilicon barrier layer, with a blanket layer of a photo, UV, X-ray or electron beam (E-beam) resist, which is patterned, using standard photo, UV, X-ray or E-beam lithographic techniques, to form a pattern of openings corresponding to a desired conductor pattern which concurrently exposes a corresponding pattern of the plasma polymerized barrier layer. Using the patterned resist as a masking layer, conformal openings can be suitably formed in the barrier layer by reactive ion etching in a suitable ambient which, as indicated above, can comprise a CF$_4$ ambient.

This is normally followed by suitable etching of conformal opening in the lift-off mask base layer, again, by reactive ion etching, normally, in the same sputtering chamber in which, for a polysulfone base, the ambient can be switched, with purging, to an oxygen containing ambient to which the plasma polymerized organosilicon is essentially resistant. As will be appreciated, the formation of the indicated conformal openings in the lift-off base layer exposes a corresponding pattern of the substrate. It is noted, that the resist layer is removed coincidently by O$_2$/RIE etching of the lift-off base layer (e.g. polysulfone).

After removal of the resist layer (which may be concurrently with $O_2$/RIE etching of the base layer), a blanket layer or coating of a conductive metal, for example, aluminum based alloys such as a 96/4 aluminum/copper alloy, is deposited (e.g. by sputtering or vacuum deposition) over the MLR on lift-off mask exposed plasma polymerized barrier layer as well as over the exposed portions of the substrate. This is followed by exposing the substrate to a solvent that is selective to the lift-off base layer (e.g. polysulfone). On solvation of the base layer component, all superimposed films and layers will lift-off to expose the remaining portions of the substrate complementary to the retained metallization pattern.

This invention also comprehends the deposition of modified plasma polymerized polyorganosilicon by the inclusion of organoborons (as for example trimethyl boroxine,

in the plasma polymerizing ambient. The resultant plasma polymerized organometallic polymer film can then be treated in an oxygen plasma (as for example a conventional oxygen plasma resist asher), which will convert the surface of the film as well as a surface adjacent portion thereof into a mixture of metal oxides which also function as an oxygen RIE barrier. The composite or modified film remains amenable to $CF_4$ and $CHF_3$ RIE etching.

Also, this modification not only permits the deposition of plasma polymerized organometallic polymer film, but also a further modification into completely or partially oxidized ($O_2$ plasma) materials, as desired. The C and H content of the film can be decreased simply by injecting oxygen into the plasma system during deposition and increasing the pressure as required.

It may be noted that deposition of silicon oxide over moisture sensitive organic substrates or surfaces is known to suffer occasionally from the problem of reticulations, particularly when humidity levels are high. In the present modification, no such problems are encountered. The organosilicon polymers are deposited by plasma polymerization at ambient or at elevated temperatures while in the silicon oxide or nitride films are in general deposited at 270° to 300° C. Also, the present modification of the invention allows tailoring of expansion coefficients at the interfaces through varying of organic content of the plasma polymerized film by selection of an appropriate monomer.

BEST MODE FOR CARRYING OUT THE INVENTION

Referring to the drawings, and to FIGS. 1A to 1H in particular, there is shown a substrate 1 which is typically monocrystalline silicon or other semiconductor material (as for example, germanium, III-V compounds and the like), with an overlying layer 2 of a dielectric coating, as for example, silicon oxide, $Si_3N_4$, or composites thereof, and the like. It may be noted that plasma polymerized organosilicon films described in this invention are also useful as dielectric coatings on conductor and semiconductor materials. The substrate 1, in this embodiment of the invention is comprehended as an integrated circuit having active and passive devices fabricated therein (not shown, but illustrated by a diffused region 3) and means for electrically isolating the devices from each other. In such application, the insulating layer 2 is normally provided with contact openings (illustrated by 4) for making contact to active and passive devices. However, the substrate can also be a body of insulating material when this invention is employed to form metallurgical patterns on a dielectric module or carrier (e.g. alumina ceramics, glass-ceramics, etc.) for supporting integrated circuit chips or devices, and appropriate associated circuitry.

Next, as shown in FIG. 1A, a blanket layer 6 of a solvent soluble organic polymer, illustratively in the range of 1 to 15 microns and preferably 1 to 3 microns, is deposited over substrate 1. Various suitable solvent soluble polymers can be used, as for example the polysulfone polymerized resin, many of which are described in U.S. Pat. No. 4,045,318. A typical polysulfone is sold under the trademark "ASTREL 360" by the 3M Company.

Another effective polymer which can be used for the base layer 6 is a conventional photoresist such as the AZ-1350 distributed by the Shipley Corporation, and which comprises a novolac-type phenol-formaldehyde resin and a o-quinonediazide photosensitive cross-linking agent. When this photoresist material (e.g. AZ-1350) is baked at about 210° C. to improve adhesion, to the substrate, the photoresist is rendered thermally stable as well as desensitized. The resist can be applied by any well known technique such as spinning, brushing, dipping and the like.

For purpose of illustration the polymeric base coating 6 can comprise of a polysulfone layer comprised of ICI polysulphone which was applied on silicon wafers by spin coating a 20 wt. % solution in diglyme N-methyl pyrrolidone solvent mixture and baked to form a coating thickness of 2 μm.

Next, a blanket barrier layer 7 of the above-described plasma polymerize organosilicon films is deposited over the solvent soluble thermally cured base layer 6. As indicated above the barrier film 7 is resistant to reactive ion etching in an oxygen containing ambient, and can be applied in a thickness range of about 500 to about 3000 Å, and preferably from about 800 to 1500 Å. For the specific embodiment, a 1,000 Å thick barrier film 7 was deposited by plasma polymerization of divinyl tetramethyldisiloxane or hexamethyldisilazane which will serve as a barrier to oxygen RIE through in-situ oxidation to $SiO_x$ like material. Thus, when this plasma polymerized film 7 was coated on a 2 μm thick layer of polysulfone and the composite subjected to $O_2$/RIE, no measurable thickness loss was observed. Also, a plasma polymerized organosilicon film 7 was formed from 1,3-divinyl tetramethyldisiloxane or hexamethyldisilazane to a thickness of 1,500 Å on the above noted ICI polysulfone base layer 6, followed immediately by an annealing schedule of 85° C. for 5 minutes, 200° C. for 10 minutes and 300° C. for 10 minutes. Alternatively, the deposition was carried out directly on a substrate heated to 100°-250° C.

Plasma polymerization of organosilicon monomers was carried out by radiofrequency discharge using an inductively coupled RF generator operated at 13.54 MHz. The substrates were positioned downstream from the glow in a chamber equipped with a rotating stage and a Sloan quartz thickness monitor. Prior to introduction of the monomer vapor at a pressure of $40$–$50 \times 10^{-3}$ torr through the inlet tube, the deposition chamber is evacuated up to $5 \times 10^{-3}$ torr. Under these conditions, with a power input of 5-20 watts, a deposition rate of 40-60 Å/minute was achieved, as measured by the quartz crystal. The plasma coatings obtained at ambient temperatures were subsequently annealed up to 300° C. on a hot plate or static oven. Various substrates employed were silicon, oxidized silicon (Si/SiO$_2$) wafers, cured polyimide films coated on silicon substrates, polysulfones and baked AZ-type coatings. Plasma films deposited on silicon were analyzed by IR transmission spectra on Nicolet FTIR instrument and ESCA, before and after annealing. These IR spectra are characteristic of organosilicon polymers except for broadening of various bands indicating complexity of polymer structure. The annealing step was found to cause increase in the Si—O—Si band intensity and decrease in the Si—C bands.

Measurements of pinhole density using Navonic Electrolosis Defect Detector, showed that the post-deposition annealing conditioned the plasma polymerized film to be consistently defect free, even after subjecting them to oxygen plasma or reactive ion etching in an oxygen ambient. Under the same conditions, 1,000 Å thick films of SiO$_x$ showed 10–12 defects/cm$^2$, while 1,200 Å thick films of silicon nitride showed 6 defects/cm$^2$.

Figure 1C:
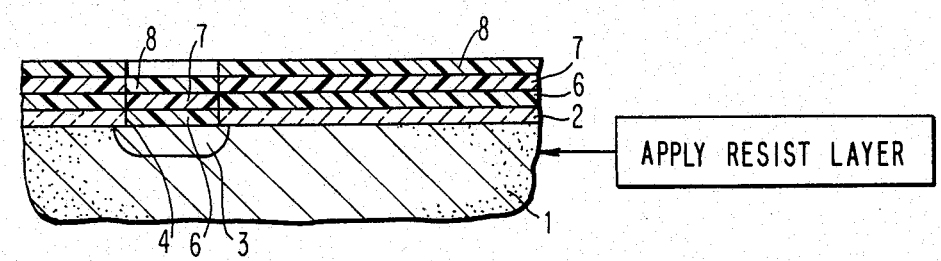

Also, as shown in FIG. 1C, a layer 8 of a photo, X-ray or E-beam resist, as for example on E-beam sensitive positive novolac/o-quinondiazide resist, of about 0.5 $\mu$m to 0.8 $\mu$m thickness is blanket coated over the barrier layer 6, by spin-coating. Openings 9A and 9B are then formed in resist layer 8 by conventional lithographic techniques well known in the integrated circuit fabrication art.

The exposed and patterned resist layer 8 is then used as a mask for reactive ion etching of the plasma polymerized barrier layer 7 to replicate in it the opening pattern of resist layer 8. Thus, openings 9A and 9B of resist layer 8 are effectively transferred into the plasma polymerized barrier layer 7 as respective openings 10A and 10B.

Figure 1D:
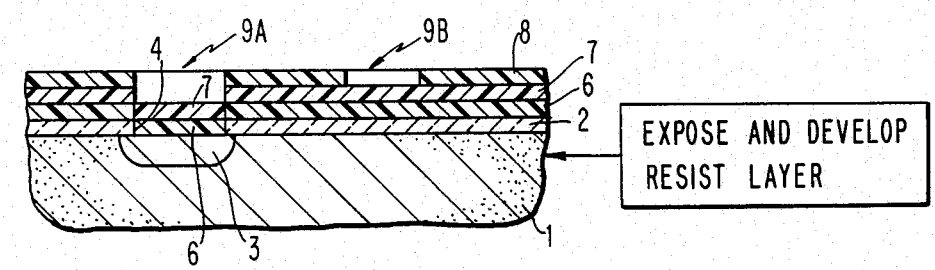

In reactive ion etching, the structure of FIG. 1D is placed in diode type system having an ambient of at least CHF$_3$ at 25 sccm flow/25$\mu$ pressure/200 watts power density. An illustrative R.F. tool which can also be employed in etching the plasma polymerized barrier layer 7 is described in U.S. Pat. No. 3,598,710.

At this point, if desired the resist layer 8 can be removed by a suitable solvent selective for the resist but not for the base polymeric layer 6. However, as indicated above, the resist layer 8 can conveniently and preferably be removed concurrently with reactive ion etching of the polymeric base layer 6 in an oxygen ambient.

Thus, utilizing the composite barrier and resist layers 8, with the openings therein, as a mask, the polymeric base layer 6, is then apertured by reactive ion etching in an oxygen containing ambient. For a polysulfone base layer 6, the etching can be accomplished over 5–8 minutes at a pressure of 20-30$\mu$ at a power density of 200 watts/cm$^2$, whereas for a desensitized Shipley AZ-1350 (a novolac/o-quinonediazide resist) base layer 6, the etching can be effective at about 100 millitorrs of O$_2$ at a power density of about 0.25 watts/cm$^2$. Alternately, the ambient could consist of O$_2$ in combination with an inert gas such as argon, nitrogen and the like. In this manner, the openings 10A and 10B in barrier layer 7 are effectively transferred into the polymeric base layer 6 as respective openings 11A and 11B. As indicated above, the remaining portions of resist layer 8 are coincidently removed by O$_2$/RIE etching of the polysulfone base layer 6.

Figure 1E:
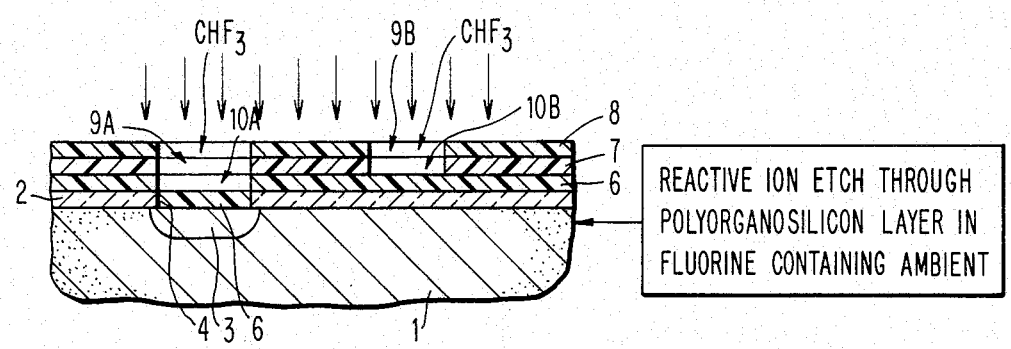
Figure 1F:
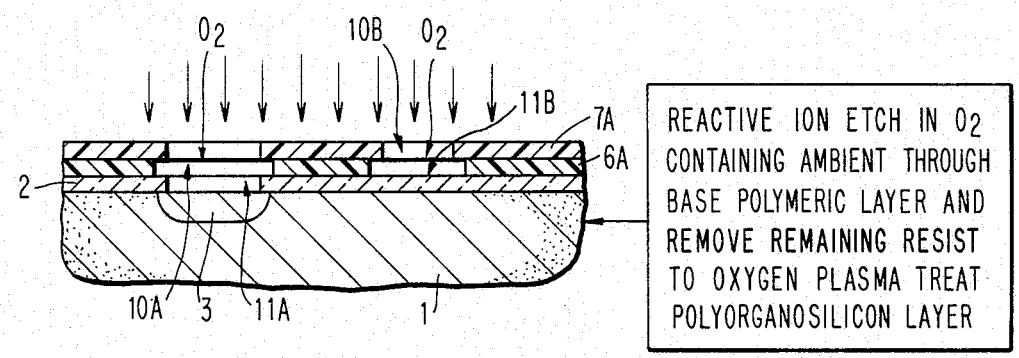

It is noted that the successive reactive ion etching steps of FIGS. 1E and 1F can be conveniently accomplished in the same reactive ion etching chamber by first utilizing a fluorine containing gas ambient, for the barrier layer 7, followed by purging and substitution of an oxygen containing ambient for the polymeric base layer 6. As shown in FIG. 1F, the O$_2$/RIE etching of the polymeric base layer 6 can be continued to extend the etching (overetch) of the base layer 6 under the barrier layer 7 to form the overhangs shown in FIG. 1F. These overhangs function to insure complete removal of the base layer 6 in openings 11A and 11B, provide for control of pattern dimensioning and insure of tearing of any overlaid coatings during lift-off of the mask, as more fully discussed in the above noted U.S. Pat. No. 4,004,044.

Figure 1G:
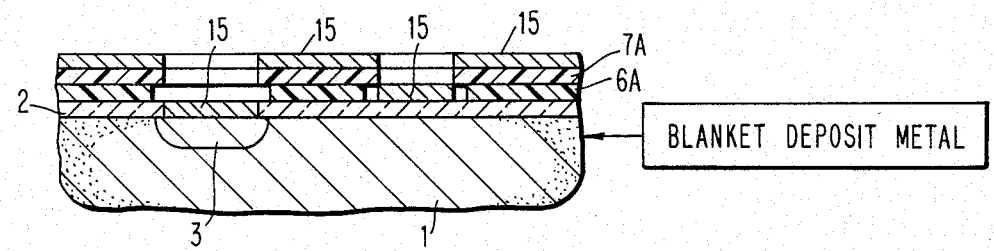

Next, using the lift-off composite 6A/7A of FIG. 1F with openings 10A/11A and 10B/11B, as a mask, a functional metal film 15 is blanket coated over the structure as shown in FIG. 1G. This metallic film 15 may be any metal conventionally used for metallization of devices in the semiconductor technology, e.g., aluminum, aluminum-copper aloys, platinum, palladium, chromium, etc. The metallization can be blanket coated by evaporation or sputtering over the surface of the structure (e.g. on the barrier layer 7A) on the portions of the substrate exposed by the openings 10A/11A and 10B/11B in the composite lift-off mask 7A/6A.

Figure 1H:
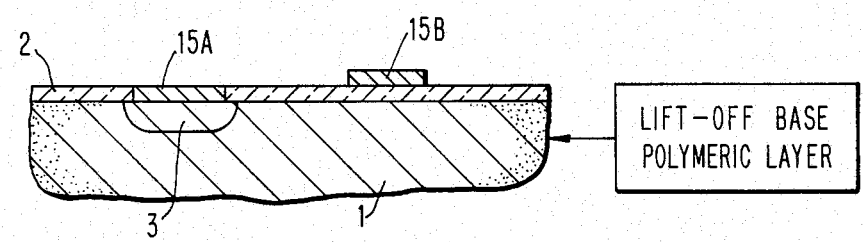

In the next operation, as shown in FIG. 1H, the lift-off mask (7A/6A) and all overlying layers of metallization 15, are then removed by exposing the substrate to a solvent specific to the polymeric base layer 6A of the lift-off mask. In the case of polysulfone base layer 6A, the solvent can be n-methylpyrrolidone at 60° C. enhanced by ultrasonic agitation. As shown in FIG. 1H, the resultant structure is provided with a metallization pattern comprised of deposited segments 15A and 15B.

In studies of plasma polymerized organosiloxane film, the following results were obtained. Thin plasma polymerized films from divinyltetramethyldisiloxane (DVS) hexamethyl disilazane (HMDS), hexamethyldisiloxane (HMS), vinyltrimethoxysilane (VTS), and $\gamma$-aminotriethoxypropyl silane (A-1100) were deposited on silicon wafers placed downstream from the glow in an inductively coupled RF plasma system at 13;56 MHz, and tested for defects, thermal stability and solvent resistance.

Defect density evaluation was by the bubble trail method using Navonic Electrolysis Defect Detector. These plasma films were deposited at 700 Å, 1,200 Å, 1,500 Å and 2,000 Å thickness on silicon wafer which were then annealed at 300° C. and examined for defects at 10$^6$ V/cm in methanol. On 2.8 cm$^2$ areas screened for each thickness, no pinholes were observed as indicated by the absence of bubble trails. On treatment in oxygen plasma or RIE the films were found to be consistently defect-free. Upon O$_2$ ashing (plasma treatment) for 5–10 minutes at 200 watts/0.8 torr O$_2$ pressure in a Tegal Plasma System, these films remained mostly defect-free with one defect/cm$^2$ detected in some cases. When tested under the same conditions, a 1,660 Å SiO$_2$ film, on silicon wafers, showed 10–15 defects per cm$^2$.

Plasma polymerization of DVS was also carried out in the presence of argon at 80:20 DVS to argon ratio. A 1,500 Å thickness of deposited film showed no detectable pinholes when tested as above.

When tested for thermal stability, the plasma polymerized DVS, HMDS, HMS and VTS films are found to be stable up to 400° C.

Thermally annealed plasma polymerized films were found to be insoluble in common organic solvents, including NMP (n-methyl pyrrolidone).

With respect to contact angles, the as-deposited plasma polymerized films on silicon substrates, have $\theta H_2O$ 80°–82° C. indicating a hydrophobic surface. When annealed up to 300° C. under nitrogen, the decreased contact angle of $\theta H_2O$ (76°–78° C.) was obtained. The contact angle is reduced to $\theta H_2O$ 10–15° when the film surface is modified by a brief oxygen plasma ashing (treatment) in the above noted Tegal plasma ashing system.

FTIR analysis of the plasma polymerized films is typified by DVS deposited on KBr discs, showed characteristic vibration frequencies for C—H (2955 $cm^{-1}$), Si—O (1032 $cm^{-1}$), Si—C (839 $cm^{-1}$) and Si—$(CH_3)_3$(839 $cm^{-1}$). ESCA data for some of the plasma polymerized organosilicon films is given in Table I. The spectral measurements were made with films deposited on gold coated substrates.

TABLE I

PLASMA DEPOSITED ORGANOSILICON FILMS: ESCA DATA*

|  | DVS | | HMDS | | A-1100 | | VTS | |
|---|---|---|---|---|---|---|---|---|
|  | A | B | A | B | A | B | A | B |
| O/C | .18 | .55 | .09 | .17 | .42 | .65 | .77 | .99 |
| Si/C | .31 | .49 | .36 | .41 | .20 | .31 | .32 | .45 |
| Si/O | 1.76 | .93 | 4.0 | 2.4 | .47 | .47 | .42 | .45 |
| N/C | — | — | .19 | .16 | .10 | .10 | — | — |
| N/O | — | — | 2.0 | .94 | .24 | .15 | — | — |
| N/Si | — | — | .5 | .40 | .51 | .32 | — | — |

Figure 2A:
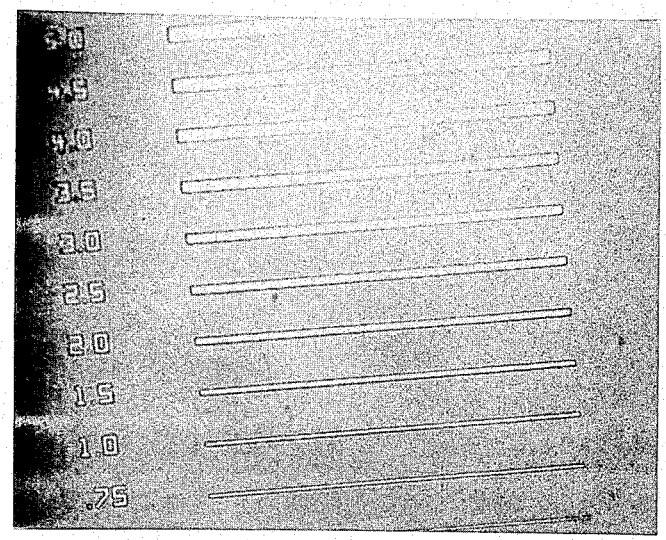
FIGS. 2A and 2B are photomicrographs illustrating transfers of images into a polysulfone layer from a pattern formed in an overcoating of a plasma polymerized organosilicon film.
Figure 2B:
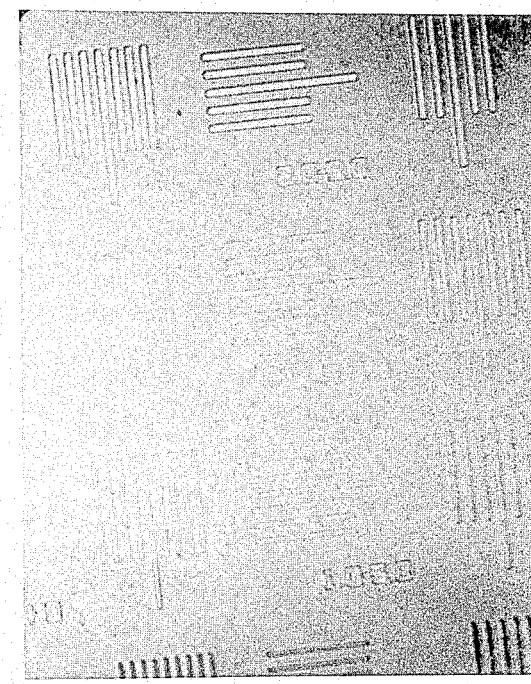

A = Data for the as-deposited films, 1500–1700 Å
B = Date for the films after annealing up to 300° C. in static oven
*Values are corrected for respective sensitivities and are the average of triplicate analysis for DVS and duplicate for all others.
DVS = Divinyltetramethyldisiloxane
HMDS = Hexamethyldisilazane
A-1100 = γ-aminopropyltriethoxysilane
VTS = Vinyltrimethoxysilane A 1,500 Å thick plasma polymerized DVS film (annealed up to 300° C. followed by a 30 second oxygen ashing in the Tegal Plasma System) was employed as an oxygen barrier in a tri-level resist structure composed of 1.1 μm thick polysulfone as the base layer and 0.85 μm thick phenol-formaldehyde/o-quinone diazide positive imaging (resist) layer. E-beam exposure at 10 μmC/cm² and conventional development gave clearly resolved 1 μm and 1.5 μm geometries. Reactive ion etching with $CHF_3$ followed by $O_2$ allowed image transfer through the barrier into the polysulfone base layer, as shown in FIGS. 2A and 2B.

In a modification of this invention, as discussed above, a 1,000 Å thick barrier film 7 was deposited on a 1.8 μm thick layer 8 of polysulfone by plasma polymerization of a 1:1 mixture of divinyltetramethyldisiloxane and trimethoxyboroxine to provide an effective oxygen/RIE barrier for the etching of the polysulfone. When a 8,000 Å film of a novolac/o-quinonediazide resist was used on top as an imaging layer 8 at 10 μmC/cm² E-beam dose, after usual development, the image could be transferred cleanly to the barrier layer 7 by $CHF_3$-RIE, and 1 μm and submicron lines could be opened. The image was then etched ($O_2$-RIE) through the polysulfone base layer 6. Here, the organometallic plasma polymerized film 7, upon exposure to $O_2$-RIE (e.g. etching of base layer 6) is converted in-situ, at top surface adjacent portions, to $SiO_xBO_y$ mixtures, which serve as an oxygen etch mask.

Also, the incorporation of boron into the plasma polymerized organosilicon polymers, enhances its $CHF_3$-RIE rate. The $CHF_3$ etch rate for plasma polymerized layers of divinyltetramethyldisiloxane is 50 Å/min, while a plasma polymerized film from a monomer mixture of trimethoxyboroxine with divinyltetramethyldisiloxane gave a film with an etch rate of 140°Å/min under the same conditions.

While the invention has been particularly shown and described with reference to the preferred embodiments thereof, it will be understood by those skilled in the art that various changes in form and detail may be made therein without departing from the spirit and scope of the invention.

What is claimed is:

1. A method for forming a patterned metal coating on an oxidized monocrystalline silicon substrate having at least one via hole in said oxide to expose surface adjacent portions of said substrate, and with said substrate having at least one integrated circuit formed therein in electrical communication with said via hole, comprising:
   A. blanket depositing a first film of a solvent soluble organic polymer over the oxidized surface and said exposed portions of said substrate, with said first polymeric film being subject to reactive ion etching in an oxygen containing ambient;
   B. plasma polymerizing over said first film a second oxygen barrier film of an organosilicon polymer film, with said second film being subject to etching in a fluorine containing ambient;
   C. heat treating said second film for about 10 to about 30 minutes at a temperature in the range of about 85° C. to about 300° C. to cross-link said second film,
   D. depositing over said second film a resist layer subject to etching in an oxygen containing ambient, including exposing and developing said resist to form a pattern of openings at least one of which is in register with a corresponding one of said via holes, and expose therebetween the corresponding portions of said second film;
   E. reactive ion etching in a fluroine containing ambient the exposed portions of said second to replicate said pattern of openings in said second film and expose corresponding portions of said first film;
   F. reactive ion etching in an oxygen containing ambient the said exposed portions of said first film to replicate said pattern of openings through said first film and remove said resist from remaining portions of said second film whereby said second film is treated by an oxygen plasma;
   G. depositing a blanket coating of a conductive film on said substrate inclusive of said openings over said substrate; and
   H. subjecting composite structure to said solvent to solvate said polymeric first film and concurrently lifting-off all superimposed films thereon so as to retain said metal film on the said exposed portions of said substrate.

2. The method of claim 1 wherein said organosilicon polymer film is formed by polymerization of monomers selected from the group consisting of organosilicones, organosilanes, organosiloxanes and mixtures thereof.

3. The method of claim 1 wherein said organosilicon polymer film is formed by polymerization of monomers represented by the formulas:

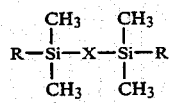

where X is zero or oxygen, NH, NR$_1$, CH$_2$,

R is CH$_3$, —CH=CH$_2$, —O—CH$_3$, —O—CH$_2$=CH$_2$,

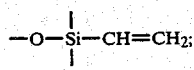

and R$_1$ is an alkyl group.

4. The method of claim 1 wherein said organosilicon polymer film is formed by polymerization of monomers represented by the formula:

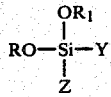

where
Y is R, or OR;
Z is —CH=CH$_2$, —CH≡CH, OR, phenyl or aminoalkane group; and
R$_1$ are an alkyl.

5. A method for forming a patterned metal coating on an oxidized monocrystalline silicon substrate having at least one via hole in said oxide to expose surface adjacent portions of said substrate, and with said substrate having at least one integrated circuit formed therein in electrical communication with said via hole, comprising:

A. blanket depositing a first film of a solvent soluble organic polymer over the oxidized surface and said exposed portions of said substrate, with said first polymeric film being subject to reactive ion etching in an oxygen containing ambient;

B. plasma polymerizing over said first film a second oxygen barrier film of an organosilicon polymer film, with said second film being subject to etching in a fluorine containing ambient; wherein said plasma polymerizing is in ambient which includes organoboron monomers whereby said formed organosilicone polymer comprises an organoborosilicon polymer barrier film, and said oxygen plasma treatment forms a borosilicate surface layer on said barrier film C. heat treating said second film for about 10 to about 30 minutes at a temperature in the range of about 85° C. to about 300° C. to cross-link said second film;

D. depositing over said second film a resist layer subject to etching in an oxygen containing ambient, including exposing and developing said resist to form a pattern of openings at least one of which is in register with a corresponding one of said via holes, and expose therebetween the corresponding portions of said second film;

E. reactive ion etching in a fluorine containing ambient the exposed portions of said second to replicate said pattern of openings in said second film and expose corresponding portions of said first film;

F. reactive ion etching in an oxygen containing ambient the said exposed portions of said first film to replicate said pattern of openings through said first film and remove said resist from remaining portions of said second film whereby said second film is treated by an oxygen plasma;

G. depositing a blanket coating of a conductive film on said substrate inclusive of said openings over said substrate; and H. subjecting the composite structure to said solvent to solvate said polymeric first film and concurrently lifting-off all superimposed films thereon so as to retain said metal film on said exposed portions of said substrate.

6. The method of claim 5 wherein said organoboron monomer comprises trimethoxy boroxine.

* * * * *